(12) United States Patent
Ohmori et al.

(10) Patent No.: US 8,018,146 B2
(45) Date of Patent: Sep. 13, 2011

(54) ELECTRONIC DEVICE AND MANUFACTURING METHOD THEREFOR

(75) Inventors: Kiwako Ohmori, Tokyo (JP); Nobuo Tanabe, Tokyo (JP); Akinobu Ono, Tokyo (JP)

(73) Assignee: Fujikura Ltd., Tokyo (JP)

( * ) Notice: Subject to any disclaimer, the term of this patent is extended or adjusted under 35 U.S.C. 154(b) by 406 days.

(21) Appl. No.: 11/768,399

(22) Filed: Jun. 26, 2007

(65) Prior Publication Data

US 2007/0249088 A1 Oct. 25, 2007

Related U.S. Application Data

(63) Continuation of application No. PCT/JP2005/023898, filed on Dec. 27, 2005.

(30) Foreign Application Priority Data

Dec. 27, 2004 (JP) ................. 2004-376275
Dec. 27, 2004 (JP) ................. 2004-376276
Dec. 27, 2004 (JP) ................. 2004-376277

(51) Int. Cl.
*H01L 51/00* (2006.01)

(52) U.S. Cl. ........................... 313/506; 445/24

(58) Field of Classification Search .......... 313/311, 313/498–512; 428/246, 327, 901
See application file for complete search history.

(56) References Cited

U.S. PATENT DOCUMENTS 7,234,984 B2 * 6/2007 Nishikawa et al. ............. 445/2
2005/0048314 A1 * 3/2005 Antoniadis et al. ........... 428/690

FOREIGN PATENT DOCUMENTS

| JP | 06-318775 A | 11/1994 |
|---|---|---|
| JP | 2000-207936 A | 7/2000 |
| JP | 2002-222056 A | 8/2002 |
| JP | 2003-234029 A | 8/2003 |
| JP | 2003-331662 A | 11/2003 |
| JP | 2004-327829 A | 11/2004 |
| WO | 2004/106404 A1 | 12/2004 |
| WO | 2005/027145 A1 | 3/2005 |

OTHER PUBLICATIONS

Translation of JP 2000-207936 to Ritsuko et al.*
Yasuteru Saito, et al., Application of Poly(3, 4-ethylenedioxythiophene) to Counter Electrode in Dye-Sensitized Solar Cells, Chemistry Letters 2002, Japan, The Chemical Society of Japan, Oct. 5, 2002, No. 10, pp. 1060-1061.

* cited by examiner

*Primary Examiner* — Anne Hines
(74) *Attorney, Agent, or Firm* — Sughrue Mion, PLLC (57) ABSTRACT

A manufacturing method for an electronic device, the method including forming a transparent conductive film, including conductive polymers, on a base material, and irradiating ultraviolet light onto a part of the transparent conductive film such that first regions of the transparent conductive film are not irradiated and second regions, adjacent to the first regions, are irradiated, thus forming irradiated portions and non-irradiated portions. The irradiated portions having an electrical resistance value higher than that of the non-irradiated portions. The ultraviolet light includes a wavelength that exhibits an absorbance in an absorption spectrum of the conductive polymers, of the transparent conductive film, two or more times higher than that of a background.

7 Claims, 7 Drawing Sheets

ELECTRONIC DEVICE AND MANUFACTURING METHOD THEREFOR

Priority is claimed from Japanese Patent Application No. 2004-376275, Japanese Patent Application No. 2004-376276, and Japanese Patent Application No. 2004-376277, all filed on Dec. 27, 2004, the contents of which are incorporated herein by reference.

TECHNICAL FIELD

The present invention relates to an electronic device such as an organic electroluminescence apparatus (organic EL apparatus) and a touch panel, to a transparent conductive circuit substrate used for the same, and to a device manufacturing method.

BACKGROUND OF THE INVENTION

Conventionally, electronic devices using a transparent conductive circuit substrate furnished with a wiring portion made of a transparent conductive film including conductive polymers are in wide use (see, for example, Japanese Unexamined Patent Application, First Publication No. 2002-222056).

The above-mentioned wiring portion is typically formed by printing a paste in which conductive polymers are dispersed in water onto a substrate by screen printing or ink jet printing such that the paste is printed in a predetermined shape (for example, in a linear shape).

However, when the wiring portion is formed by use of conductive polymers, the result is sometimes a wiring portion with an imperfect shape. This is because the wiring portion may be deformed by a mixture of bubbles into the paste, by an oozing of the paste on the substrate, or a repulsion of the paste by the substrate, due to properties (viscosity, etc.) of the paste.

When the wiring portion has an imperfect shape, the electrical resistance value of the wiring portion sometimes becomes unstable.

It is possible to adjust the shape of the wiring portion by stackingly coating an additional paste on top of the coated paste. In this case, however, the wiring portion becomes thick, thereby reducing its transparency. Moreover, this has posed a problem that it is disadvantageous in terms of cost because more manufacturing steps are required.

SUMMARY OF THE INVENTION

The present invention has been developed in view of the above circumstances, and has an object to provide an electronic device that has a transparent conductive film using conductive polymers with favorable conductivity and light transmittance and that has a reduced cost, a transparent conductive circuit substrate used therefore, and an electronic device manufacturing method therefore.

An electronic device manufacturing method according to a first aspect of the present invention is a manufacturing method for an electronic device. The method includes a film formation step of forming a transparent conductive film, including conductive polymers, on the base material; and an ultraviolet light irradiation step of irradiating ultraviolet light onto a part of the transparent conductive film, such that at least one first region of the transparent conductive film is not irradiated and at least one second region, adjacent to the first region, is irradiated, thus forming at least one irradiated portion and at least one non-irradiated portion. The at least one irradiated portions has an electrical resistance value higher than that of the at least one non-irradiated portion. The ultraviolet light in the ultraviolet light irradiation step includes a wavelength that exhibits an absorbance in an absorption spectrum of the conductive polymers two or more times higher than that of a background.

An electronic device manufacturing method according to a second aspect of the present invention is the above-mentioned electronic device manufacturing method, having a curing step of drying and curing the transparent conductive film prior to the ultraviolet irradiation step.

An electronic device according to a third aspect of the present invention is provided with a transparent conductive film, including conductive polymers and a radical polymerization initiator, on a base material. The transparent conductive film has at least one first region and at least one second region, adjacent to the first region, the at least one second region having an electrical resistance value higher than that of the at least one first region.

An electronic device according to a fourth aspect of the present invention is the above-mentioned electronic device, in which the at least one first region forms a wiring portion of a circuit disposed on the base material.

An electronic device according to a fifth aspect of the present invention is the above-mentioned electronic device, in which an electronic resistance value of the at least one second region is $10^4$ or more times that of the at least one first region.

A transparent conductive circuit substrate according to a sixth aspect of the present invention is provided with a transparent conductive film, including conductive polymers and a radical polymerization initiator, on a base material, in which the transparent conductive film has at least one first region and at least one second region, adjacent to the first region, the sat least one second region having an electrical resistance value higher than that of the at least one first region, and the at least one first region forms a wiring portion of a circuit on the base material.

An electronic device manufacturing method according to a seventh aspect of the present invention is a manufacturing method including a film formation step of forming a transparent conductive film, including conductive polymers, on a base material, and an ultraviolet light irradiation step of irradiating ultraviolet light onto a part of the transparent conductive film, such that at least one first region of the transparent conductive film is not irradiated and at least one-second region, adjacent to the first region, is irradiated, thus forming at least one irradiated portion and at least one non-irradiated portion. The at least one irradiated portion has an electrical resistance value higher than that of the at least one non-irradiated portion.

An electronic device manufacturing method according to an eighth aspect of the present invention is the above-mentioned electronic device manufacturing method, having a curing step of drying and curing the transparent conductive film prior to the ultraviolet irradiation step.

An electronic device according to a ninth aspect of the present invention is provided with a transparent conductive film, including polythiophene-based conductive polymers, on a base material. The transparent conductive film has at least one first region and at least one second region, adjacent to the first region, the at least one second region having an electrical resistance value higher than that of the at least one first region.

An electronic device according to a tenth aspect of the present invention is the above-mentioned electronic device, in which the at least one first region forms a wiring portion of a circuit.

An electronic device according to an eleventh aspect of the present invention is the above-mentioned electronic device, in which an electronic resistance value of the at least one second region is $10^4$ or more times that of the at least one first region.

A transparent conductive circuit substrate according to a twelfth aspect of the present invention is provided with a transparent conductive film, including polythiophene-based conductive polymers, on a base material, in which the transparent conductive film has at least one first region and at least one second region, adjacent to the first region, the at least one second region having an electrical resistance value higher than that of the at least one first region, and the at least one first region forms a wiring portion of a circuit.

An electronic device manufacturing method according to a thirteenth aspect of the present invention including a film formation step of forming a transparent conductive film, including polythiophene-based conductive polymers, on a base material, and an ultraviolet light irradiation step of irradiating ultraviolet light onto a part of the transparent conductive film, such that at least one first region of the transparent conductive film is not irradiated and at least one second regions, adjacent to the first region, is irradiated, thud forming at least one irradiated portion and at least one non-irradiated portion. The at least one irradiated portion has an electrical resistance value higher than that of the at least one non-irradiated portion.

An electronic device manufacturing method according to a fourteenth aspect of the present invention is the above-mentioned device manufacturing method, having a curing step of drying and curing the transparent conductive film prior to the ultraviolet irradiation step.

According to the first and second aspects of the present invention, the ultraviolet light in the ultraviolet light irradiation step includes a wavelength that exhibits an absorbance in an absorption spectrum of the conductive polymers two or more times higher than that of the background. Thus, the conductivity of the at least one irradiated portion can be effectively reduced.

As a result, the first region and the second region can be formed by short-time ultraviolet light irradiation. Therefore, manufacturing efficiency can be improved and manufacturing costs can be reduced.

Furthermore, since the first region and the second region can be formed by short-time ultraviolet light irradiation, the conductivity of the first region as a non-irradiated portion can be prevented from reducing due to ultraviolet light.

Therefore, the first region with favorable conductivity can be formed.

Moreover, the first region and the second region are formed in the transparent conductive film by ultraviolet light irradiation. Thus, formation failure of the wiring portion due to oozing of the paste or the like is less likely to occur compared with the case of the prior-art product in which the wiring portion is formed by printing, thereby allowing formation of the first region with an accurate shape.

Therefore, the conductivity of the first region (wiring portion) can be made favorable.

Furthermore, since the shape of the first region can be formed accurately, the transparent conductive film can be thinly formed without reducing the conductivity of the first region.

Therefore, light transmittance of the transparent conductive film can be increased.

According to the third to eighth aspects of the present invention, the transparent conductive film includes a radical polymerization initiator. Therefore, reactivity of the conductive polymers to ultraviolet light is high, which prompts a reaction of reducing conductivity.

As a result, the first region and the second region can be formed by short-time ultraviolet light irradiation. Thus, manufacturing efficiency can be improved and manufacturing costs can be reduced.

Moreover, since the first region and the second region can be formed by short-time ultraviolet light irradiation, the first region as the non-irradiated portion can be prevented from deteriorating due to ultraviolet light.

Therefore, the conductivity of the first region (wiring portion) can be made favorable.

Furthermore, since the radical polymerization initiator can improve reactivity of the conductive polymers to ultraviolet light, a reaction of reducing conductivity can be prompted even in a deep region of the transparent conductive film.

As a result, even when the transparent conductive film is thickly formed, the first region can be formed with an accurate shape (for example, a cross sectional rectangular shape).

Moreover, formation failure of the wiring portion due to oozing of the paste or the like is less likely to occur compared with the case of the prior-art product in which the wiring portion is formed by printing, thereby allowing formation of the first region with an accurate shape.

As a result, the transparent conductive film can be thinly formed without reducing the conductivity of the first region.

Therefore, light transmittance of the transparent conductive film can be increased.

According to the ninth to fourteenth aspects of the present invention, the transparent conductive film is provided with the first region (low-resistance region) and the second region (high-resistance region). Thus, formation failure of the wiring portion due to oozing of the paste or the like is less likely to occur compared with the case of the prior-art product in which the wiring portion is formed by printing, thereby allowing formation of the first region with an accurate shape. Therefore, the conductivity of the first region (wiring portion) can be made favorable.

Moreover, the first region and the second region are both formed in the transparent conductive film, which leads to a simple configuration. This enables the manufacture thereof to be easy and low in cost.

Furthermore, the shape of the first region can be formed accurately. Thus, the transparent conductive film can be thinly formed without reducing the conductivity of the first region.

Therefore, light transmittance of the transparent conductive film can be increased.

DETAILED DESCRIPTION OF THE INVENTION

First Exemplary Embodiment

Figure 1:
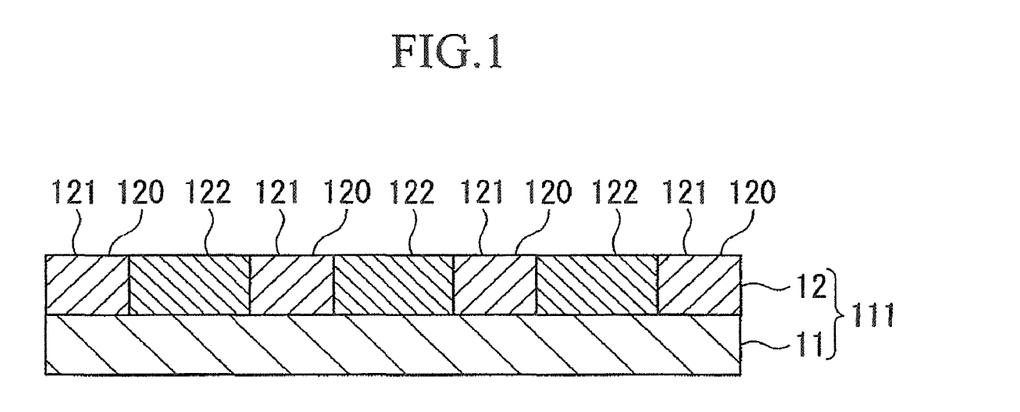
FIG. 1 is a schematic block diagram showing a transparent conductive circuit substrate obtained by an electronic device manufacturing method according to a first embodiment of the present invention.

FIG. 1 is a cross-sectional view showing a part of one example of a transparent conductive circuit substrate obtained by an electronic device manufacturing method according to a first embodiment of the present invention.

The transparent conductive circuit substrate 111 is furnished with a transparent conductive film 12 including conductive polymers on a base material 1.

The base material 1 is made of a transparent material, for example, polyethylene terephthalate (PET), and is formed in a plate or film shape.

The transparent conductive film 12 is made of conductive polymers having an electrical resistance value that is increased by ultraviolet irradiation.

The transparent conductive film 12 has first regions 121 and second regions 122 formed adjacent to the first regions 121.

The first regions 121 are low-resistance regions with a comparatively low electrical resistance value. The first regions 121 can have an electrical resistance value (surface resistance) of, for example, $10^3 \Omega/\square$ or less.

The first regions 121 are wiring portions 120 that are used for a transparent conductive circuit.

The first regions 121 are not particularly limited with respect to their shape. they may have a linear shape with a predetermined width.

The second regions 122 are high-resistance regions with an electrical resistance higher than that of the first region 121.

The second regions 122 may have an electrical resistance value (surface resistance) $10^4$ or more times (preferably $10^5$ or more times) than that of the first regions 121. Specifically, they can have an electrical resistance value of $10^8 \Omega/\square$ or more.

Making the electrical resistance value of the second regions 122 $10^4$ or more times that of the first regions 121 can improve the insulativity between neighboring parts of the wiring portion 120, and make the conductivity of the wiring portion 120 favorable.

As for the conductive polymer, a polythiophene-based conductive polymer may be used.

As for the polythioplhene-based conductive polymer, for example, one formed with a cation structure by doping an undoped polymer having a principal chain of a polythiophene-based polymer shown in Formula (1) with a halogen such as iodine or other oxidant to partially oxidize the polymer can be used.

In Formula (1), groups $R^1$ and $R^2$ are independently selectable. The following can be exemplified: a hydrogen atom; a halogen atom such as fluorine, chlorine, bromine, or iodine; a cyano group; a straight-chain alkyl group such as methyl, ethyl, propyl, butyl (n-butyl), pentyl (n-pentyl), hexyl, octyl, dodecyl, hexadecyl, or octadecyl; a branched-chain alkyl group such as isopropyl, isobutyl, sec-butyl, tert-butyl, isopentyl, or neopentyl; an alkoxy group with a straight- or branched-chain such as methoxy, ethoxy, propoxy, isopropoxy, butoxy, isobutoxy, sec-butoxy, or tert-butoxy; an alkenyl group such as vinyl, propenyl, allyl, butenyl, or oleyl; an alkynyl group such as ethynyl, propynyl, or butynyl; an alkoxyalkyl group such as methoxymethyl, 2-methoxyethyl, 2-ethoxyethyl, and 3-ethoxypropyl; a polyether group such as $C_2H_5O(CH_2CH_2O)_mCH_2CH_2$ group (m is an integer equal to or more than one) or $CH_3O(CH_2CH_2O)_mCH_2CH_2$ group (m is an integer equal to or more than one); and a halogen-substituted derivative, such as a fluoromethyl group, in which the above substituent is substituted with fluorine or the like.

The conductive polymer may include a π-conjugated bond in the principal chain thereof.

As for the polythiophene-based polymer, 3,4-ethylenedioxythiophene) (PEDOT) may be used. Especially, PEDOT-PSS, which is PEDOT doped with polystyrene sulfonate (PSS), may be used.

A conductive film made of PEDOT-PSS can be produced, for example, as follows:

Fe(III)tris-p-toluenesulfonate solution and 1-butanol solution of imidazole are added to 3,4-ethylenedioxythiophene monomer. The mixture is coated on a base material. After the base material is heated and dried, the base material is rinsed in methanol to remove Fe(II)bis-p-toluenesulfonate.

As for commercially available products usable as polythiophene-based polymers, Baytron P manufactured by H. C. Starck-V TECH Ltd., Denatron #5002LA manufactured by Nagase & Co. Ltd., and Orgacon S300 manufactured by Agfa-Gevaert Group can be listed.

Figure 2A:
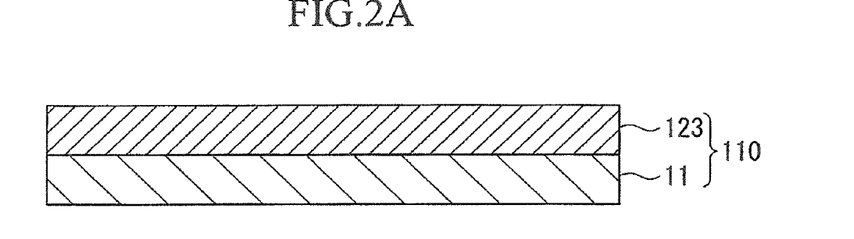
FIGS. 2A, 2B, and 2C are drawings illustrating a manufacturing method for the transparent conductive circuit substrate shown in FIG. 1 step-by-step.
Figure 2B:
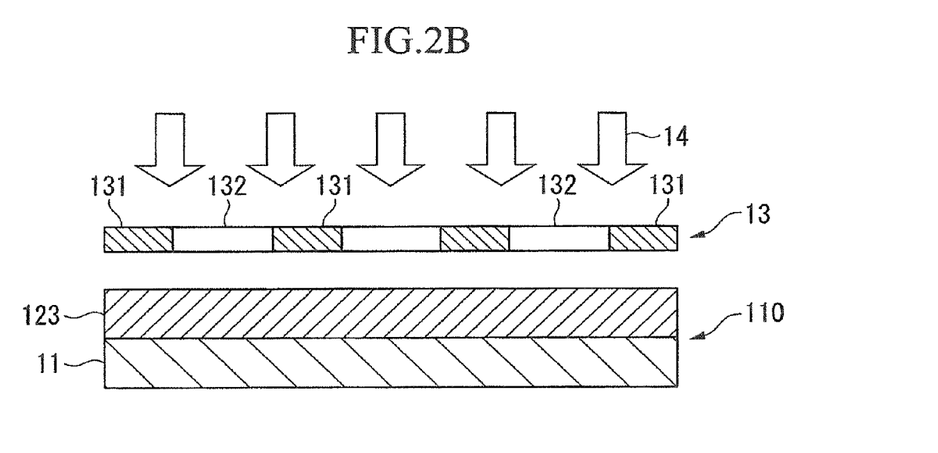
Figure 2C:
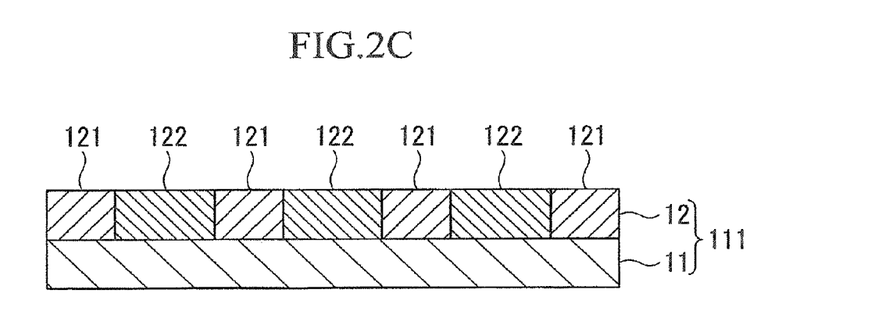

Next, a manufacturing method for the transparent conductive circuit substrate 111 according to the first embodiment of the present invention will be described.

As shown in FIG. 2A, a transparent conductive film 123 with a substantially uniform thickness is formed on a base material 1 by coating raw material liquid including conductive polymers over the entirety of the base material 1 or by other methods to obtain a conductive substrate 110 (film formation step).

Coating of the raw material liquid can be performed also by dip coating, spin coating, bar coating, or the like. Note that the transparent conductive film 123 may be formed by a method other than coating.

Figure 3:
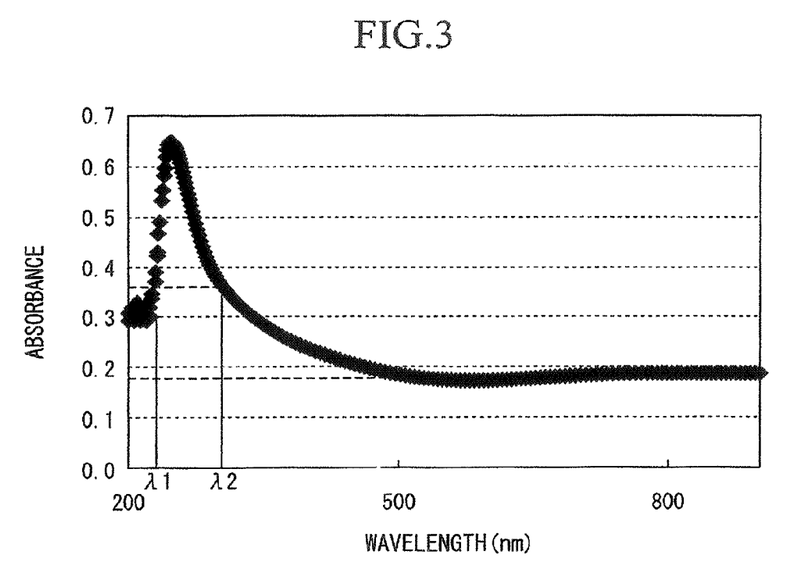
FIG. 3 is a graph showing an ultraviolet absorption spectrum of the transparent conductive film.

FIG. 3 shows one example of an ultraviolet absorption spectrum of a conductive polymer usable for the transparent conductive film 123. As shown in the figure, the absorbance of the conductive polymer is at a maximum (a local maximum) at a wavelength of about 240 nm, and is substantially the steady-state value (background) in the range of 500 nm or higher.

As shown in FIG. 2B, ultraviolet light 14 is irradiated onto the transparent conductive film 123.

At this time, a mask 13 with a non-transmissive portion 131 and a transmissive portion 132 is applied to the transparent conductive film 123, and the ultraviolet light 14 is irradiated through the mask 13 (ultraviolet irradiation step).

As for the ultraviolet light 14, one that includes a wavelength showing an absorbance in its absorption spectrum two or more times (preferably, but not necessarily, 2.5 or more times) higher than that of a background is used.

In the example shown in FIG. 3, the absorbance of the background is 0.18. Therefore, the absorbance corresponding to twice that of the background is 0.36. The lower limit value λ1 of the wavelength that shows the absorbance corresponding to 0.36 or more is 225 nm and the upper limit value λ2 thereof is 300 nm.

That is, as for the ultraviolet light 14, one including a wavelength of 225 to 300 nm is used. Moreover, a wavelength that exhibits an absorbance 2.5 or more times higher than that of the background is 230 to 280 nm.

The intensity of the ultraviolet light 14 may be 100 mW or more, and the irradiation time thereof may be 30 seconds or more.

As shown in FIG. 2C, the portion irradiated with the ultraviolet light 14 through the transmissive portion 132 (irradiated portion) undergoes a decrease in conductivity to form the second regions 122 as the high-resistance regions.

The portion shielded from the ultraviolet light 14 by the non-transmissive portion 131 (non-irradiated portion) does not undergo a decrease in conductivity and thus forms the first regions 121, which are the low-resistance regions.

When the irradiation direction of the ultraviolet light 14 is substantially perpendicular to the transparent conductive film 123, the regions 121 and 122 are substantially rectangular in cross-section.

By the above operations, the transparent conductive circuit substrate 111 shown in FIG. 1 is obtained.

In the above manufacturing method, the ultraviolet light 14 irradiated onto the transparent conductive film 123 in the ultraviolet light irradiation step includes a wavelength that shows the above-mentioned absorbance two or more times higher than that of the background. Therefore, the conductivity of the irradiated portion can be efficiently reduced.

As a result, the first region 121 and the second region 122 are allowed to be formed by short-time ultraviolet light irradiation. Thus, manufacturing efficiency can be improved and manufacturing costs can be reduced.

Moreover, since the first regions 121 and the second regions 122 are allowed to be formed by a short-time irradiation of ultraviolet light, the conductivity of the first regions 121 as the non-irradiated portions can be prevented from deteriorating due to ultraviolet light 14. Therefore, the conductivity of the wiring portions 120 can be made favorable.

Moreover, the first regions 121 and the second regions 122 are formed in the transparent conductive film 12 by ultraviolet light irradiation. Thus, formation failure of the wiring portions due to oozing of the paste or the like is less likely to occur compared with the case of the prior-art product in which the wiring portions is formed by printing, thereby allowing formation of the first regions 121 with an accurate shape.

Therefore, the conductivity of the wiring portion 120 can be made favorable. Moreover, the wiring portions 120 with a narrow width can be formed with ease.

Furthermore, since the shape of the first regions 121 can be formed accurately, the transparent conductive film 12 can be thinly formed without reducing the conductivity of the first regions 121.

Therefore, light transmittance of the transparent conductive film 12 can be increased.

Without being bound to any theory regarding the reason why the transparent conductive film 123 undergoes reduction in conductivity in the region irradiated with the ultraviolet light 14, the following is believed:

In the above conductive polymer, the bond energy in the molecule is in the energy range of ultraviolet light. Therefore, the bond is radically cleaved by the irradiation of ultraviolet light. As a result, the conductivity is decreased.

As for the above polymer, one having a maximum ultraviolet absorption wavelength of 380 nm or less, or 330 nm or less may be used.

When a conductive polymer with the maximum absorption wavelength within this range is used, the ultraviolet light that satisfies the aforementioned condition comes to have a comparatively short wavelength. Therefore, the ultraviolet light is highly likely to travel in a straight line and does not spread when irradiated through the mask. As a result, the wiring portion 120 with an accurate shape (for example, cross-sectional rectangular shape) can be formed.

The maximum ultraviolet absorption wavelength of the conductive polymer may be 220 nm or more.

When a conductive polymer with the maximum absorption wavelength within this range is used, ultraviolet light is likely to reach a deep portion of the transparent conductive film.

In the present invention, prior to the ultraviolet irradiation step, a curing step of drying and curing the transparent conductive film 123 may be performed.

The temperature condition in this step can be set to, for example, from 50 to 130° C. The treatment time may be from 1 to 10 minutes.

Curing the transparent conductive film 123 allows the mask 13 to abut the transparent conductive film 12 in the ultraviolet irradiation step.

Therefore, the regions 121 and 122 corresponding accurately to the shapes of the non-transmissive portions 131 and the transmissive portions 132 can be formed.

As for an electronic device to which the transparent conductive circuit substrate 111 is applied, a display apparatus such as an organic EL apparatus can be used in which a light-emission element (not shown) is provided on the transparent conductive circuit substrate 111.

In the transparent conductive circuit substrate 111, the thickness of the transparent conductive film 12 can be made uniform, thereby making the light transmittance of the transparent conductive film 12 uniform.

Therefore, when the transparent conductive circuit substrate 111 is used for a display apparatus such as an organic EL apparatus, the display properties thereof can be improved.

As another example of an electronic device, a touch panel can be used in which a conductive layer (not shown) is provided above the transparent conductive circuit substrate 111 spaced apart such that the conductive layer is brought into contact with the wiring portion 120 by depression from above.

Examples 1-1 to 1-3

On a base material 1 made of a PET film (Lumirror S10 manufactured by Toray Industries, Inc.) with a length of 15 cm, a width of 15 cm, and a thickness of 188 μm, a transparent conductive film 123 made of transparent conductive ink was formed including polythiophene-based conductive polymers (Denatron #5002LA manufactured by Nagase & Co. Ltd.) by dip coating to obtain a conductive substrate 110. The transparent conductive film 123 was dried at a temperature of 80° C. for two minutes to be cured.

As for the conductive polymer, one that shows the ultraviolet absorption spectrum showing in FIG. 3 was used.

Ultraviolet light 14 was irradiated onto the transparent conductive film 123 through a mask 13 having a non-transmissive portions 131 with a width of 10 mm to obtain a transparent conductive circuit substrate 111 having a first regions 121 (wiring portion 120) with a width of 10 mm and second regions 122.

The ultraviolet light 14 was irradiated in a condition that light with up to a predetermined wavelength was cut off by use of a cut filter. The irradiation intensity of the ultraviolet light 14 was 500 mW/cm$^2$.

The results of the chronological measurements of the surface resistance of the portions irradiated with the ultraviolet light 14 are shown in Table 1.

The surface resistances of the first region 121 for all the examples were 800Ω/□.

Comparative Example 1-1

A transparent conductive circuit substrate 111 was manufactured in a similar manner to Example 1-1 with the exception being that a cut filter with a different cutoff wavelength was used.

The results of the chronological measurements of the surface resistance of the portion irradiated with the ultraviolet light 14 are shown in Table 1.

The surface resistance of the first regions 121 was 800Ω/□.

Figure 4:
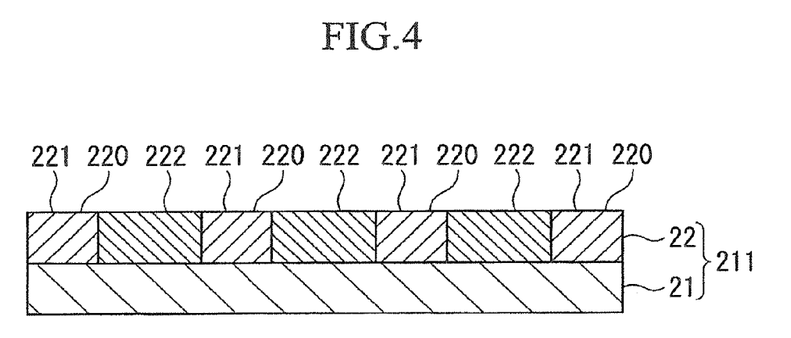
FIG. 4 is a schematic block diagram showing a transparent conductive circuit substrate usable in an electronic device according to a second embodiment of the present invention.

The transparent conductive circuit substrate 211 is furnished with a transparent conductive film 22 including conductive polymers on a base material 21.

The base material 21 is made of a transparent material, for example, polyethylene terephthalate (PET), and is formed in a plate or film shape.

The transparent conductive film 22 has first regions 221 and second regions 222 formed adjacent to the first regions 221.

The transparent conductive film 22 is made of conductive polymers having an electrical resistance value that is increased by irradiation of ultraviolet light.

The first regions 221 are low-resistance regions with a comparatively low electrical resistance value. The first regions 221 may have an electrical resistance value (surface resistance) of, for example, $10^3$Ω/□ or less.

The first regions 221 are wiring portions 220 that are used for a transparent conductive circuit.

The first regions 221 are not particularly limited with respect to their shape. They may have a linear shape with a predetermined width.

The second regions 222 are high-resistance regions with an electrical resistance higher than that of the first region 221.

The second regions 222 may have an electrical resistance value (surface resistance) $10^4$ or more times (preferably, but not necessarily, $10^5$ or more times) than that of the first regions 221. Specifically, they can have an electrical resistance value of $10^8$Ω/□ or more.

Making the electrical resistance value of the second regions 222 $10^4$ or more times that of the first regions 221 can improve the insulativity between neighboring parts of the wiring portions 220, and make the conductivity of the wiring portions 220 favorable.

TABLE 1

| | | Example 1-1 | Example 1-2 | Example 1-3 | Comp. Ex. 1-1 |
|---|---|---|---|---|---|
| Wavelength of light cut off by cut filter | | 220 nm or less | 260 nm or less | 290 nm or less | 330 nm or less |
| Surface resistance (Ω/□) | At start of irradiation | 800 | 800 | 800 | 800 |
| | after 10 min. | 1.0 × 10$^8$↑ | 1.0 × 10$^8$↑ | 7.0 × 10$^5$ | 1.0 × 10$^5$ |
| | after 15 min. | 1.0 × 10$^8$↑ | 1.0 × 10$^8$↑ | 5.0 × 10$^6$ | 1.0 × 10$^6$ |
| | after 20 min. | 1.0 × 10$^8$↑ | 1.0 × 10$^8$↑ | 1.0 × 10$^8$↑ | 1.0 × 10$^8$↑ |

("1.0 × 10$^8$↑ Ω/□" means that the measured value exceeded a measurement limit value of 1.0 × 10$^8$ Ω/□.)

Table 1 shows that the resistance value in the irradiated regions rose in a short period of time in Example 1-1 using ultraviolet light with a wavelength over 220 nm, Example 1-2 using ultraviolet light with a wavelength over 260 nm, and Example 1-3 using ultraviolet light with a wavelength over 290 nm.

In contrast to this, it took a comparatively long time for the resistance value to rise in Comparative Example using ultraviolet light with a wavelength over 330 nm.

These results reveal that irradiation of ultraviolet light with a wavelength (225 to 300 nm) that shows absorbance two or more times higher than that of the background can form the first region 121 and the second region 122 in a short period of time.

Second Exemplary Embodiment

FIG. 4 is a cross-sectional view showing a part of one example of a transparent conductive circuit substrate according to a second embodiment of the present invention.

As for the conductive polymer, a polythiophene-based conductive polymer may be used.

As for the polythiophene-based conductive polymer, for example, one formed with a cation structure by doping an undoped polymer having a principal chain of a polythiophene-based polymer shown in Formula (1) with a halogen such as iodine or other oxidant to partially oxidize the polymer can be used.

(1)

In Formula (1), groups $R^1$ and $R^2$ are independently selectable. The following can be exemplified: a hydrogen atom; a halogen atom such as fluorine, chlorine, bromine, or iodine; a cyano group; a straight-chain alkyl group such as methyl, ethyl, propyl, butyl (n-butyl), pentyl (n-pentyl), hexyl, octyl, dodecyl, hexadecyl, or octadecyl; a branched-chain alkyl group such as isopropyl, isobutyl, sec-butyl, tert-butyl, isopentyl, or neopentyl; an alkoxy group with a straight- or branched-chain such as methoxy, ethoxy, propoxy, isopropoxy, butoxy, isobutoxy, sec-butoxy, or tert-butoxy; an alkenyl group such as vinyl, propenyl, allyl, butenyl, or oleyl; an alkynyl group such as ethynyl, propynyl, or butynyl; an alkoxyalkyl group such as methoxymethyl, 2-methoxyethyl, 2-ethoxyethyl, and 3-ethoxypropyl; a polyether group such as $C_2H_5O(CH_2CH_2O)_mCH_2CH_2$ group (m is an integer equal to or more than one) or $CH_3O(CH_2CH_2O)_mCH_2CH_2$ group (m is an integer equal to or more than one); and a halogen-substituted derivative, such as a fluoromethyl group, in which the above substituent is substituted with fluorine or the like.

The conductive polymer may include a π-conjugated bond in the principal chain thereof.

As for the polythiophene-based polymer, 3,4-ethylenedioxythiophene) (PEDOT) is preferable. Especially, PEDOT-PSS, which is PEDOT doped with polystyrene sulfonate (PSS), may be used.

A conductive film made of PEDOT-PSS can be produced, for example, as follows:

Fe(III)tris-p-toluenesulfonate solution and 1-butanol solution of imidazole are added to 3,4-ethylenedioxythiophene monomer. The mixture is coated on a base material. After the base material is heated and dried, the base material is rinsed in methanol to remove Fe(II)bis-p-toluenesulfonate.

As for commercially available products usable as polythiophene-based polymers, Baytron P manufactured by H. C. Starck-V TECH Ltd., Denatron #5002LA manufactured by Nagase & Co. Ltd., and Orgacon S300 manufactured by Agfa-Gevaert Group can be used.

A radical polymerization initiator is added to the transparent conductive film 22.

Radical polymerization initiators are generally used to start radical polymerization. They have a function to generate energy such as light to start radical polymerization.

As for a radical polymerization initiator, an azo compound, an organic peroxide, and an inorganic peroxide can be used.

As for an azo compound, an azoamide-based compound, azobisisobutyronitrile (AIBN), diazoaminobenezene, and the like can be used.

As for an organic peroxide, benzoyl peroxide (BPO), diisopropyl peroxydicarbonate, and the like can be used.

As for an inorganic peroxide, persulfate, perchlorate, and the like can be used.

An azoamide-based compound with high water solubility can be used.

The amount of the radical polymerization initiator added may be 0.1% by mass or more. Limiting the amount to be added within this range can increase the reaction rate at which the conductivity of the transparent conductive film 2 is reduced by ultraviolet light. The amount to be added may be 0.5% by mass or more, or 1% by mass or more.

There is a possibility that too large amount of the radical polymerization initiator added will make it unlikely to cause the above-mentioned reaction of reducing conductivity. Therefore, the amount to be added may be 10% by mass or less.

Figure 5A:
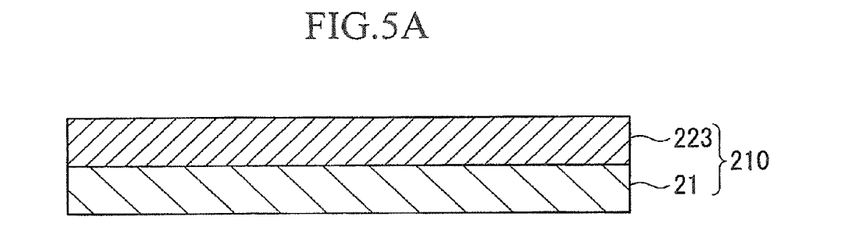
FIGS. 5A, 5B, and 5C are drawings illustrating a manufacturing method for the transparent conductive circuit substrate shown in FIG. 4 step-by-step.
Figure 5B:
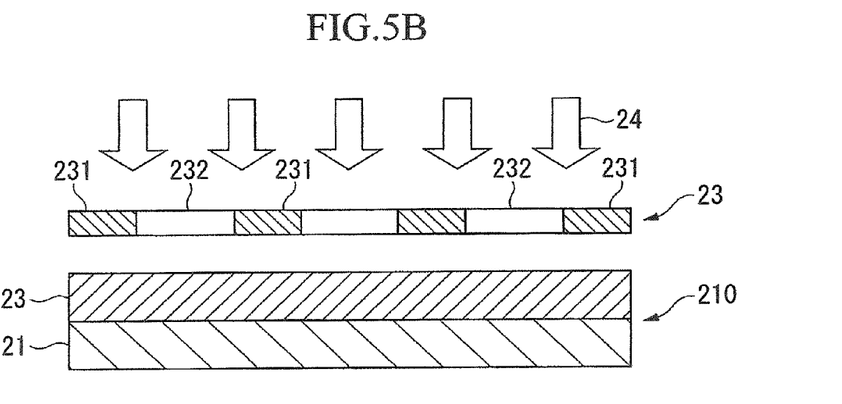
Figure 5C:
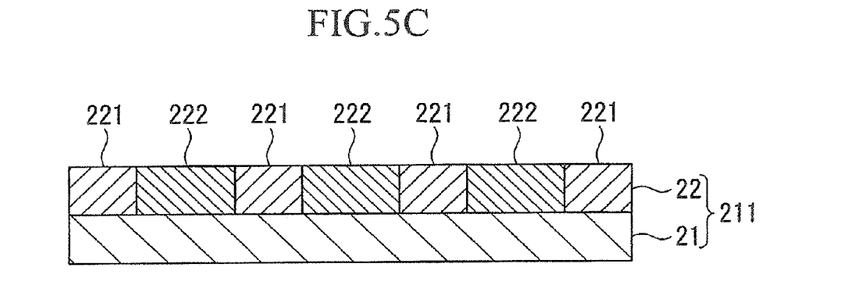

Next, a manufacturing method for the transparent conductive circuit substrate 211 according to the second embodiment of the present invention will be described.

As shown in FIG. 5A, a transparent conductive film 223 with a substantially uniform thickness is formed on a base material 21 by coating raw material liquid including conductive polymers over the entirety of the base material 21 or by other methods to obtain a conductive substrate 210 (film formation step).

Coating of the raw material liquid can be performed also by dip coating, spin coating, bar coating, or the like. Note that the transparent conductive film 223 may be formed by a method other than coating.

As shown in FIG. 5B, ultraviolet light 24 is irradiated onto the transparent conductive film 223.

At this time, a mask 23 with a non-transmissive portion 231 and a transmissive portion 232 is applied to the transparent conductive film 223, and the ultraviolet light 24 is irradiated through the mask 23 (ultraviolet irradiation step).

The ultraviolet light 24 has a wavelength of, for example, from 230 to 280 nm.

The intensity of the ultraviolet light 24 may be 100 mW or more, and the irradiation time thereof may be, for example, 30 seconds or more.

As shown in FIG. 5C, the portion irradiated with the ultraviolet light 24 through the transmissive portions 232 (irradiated portion) undergoes a decrease in conductivity to form the second regions 222 as the high-resistance regions.

The transparent conductive film 22 includes a radical polymerization initiator. Therefore, it has a high reactivity of the conductive polymers to the ultraviolet light, thus prompting the reaction of reducing conductivity.

As a result, the first regions 221 and the second regions 222 are allowed to be formed by a short-time ultraviolet irradiation. Thus, manufacturing efficiency can be improved and manufacturing costs can be reduced.

Moreover, since the first regions 221 and the second regions 222 are allowed to be formed by a short-time ultraviolet irradiation, the first regions 221 as the non-irradiated portions can be prevented from degrading due to ultraviolet light.

Therefore, the conductivity of the first regions 221 (wiring portions 220) can be made favorable.

The portions shielded from the ultraviolet light 24 by the non-transmissive portions 231 (non-irradiated portions) do not undergo a decrease in conductivity and thus forms the first regions 221, which are the low-resistance regions.

When the irradiation direction of the ultraviolet light 24 is substantially perpendicular to the transparent conductive film 23, the regions 221 and 222 are substantially rectangular in cross-section.

By the above operations, the transparent conductive circuit substrate 211 shown in FIG. 4 is obtained.

Since the radical polymerization initiator can improve reactivity of the conductive polymers to ultraviolet light in the above transparent conductive circuit substrate 211, a reaction of reducing conductivity can be prompted even in a deep region of the transparent conductive film 22.

As a result, even when the transparent conductive film 22 is thickly formed, the first regions 221 with an accurate shape (for example, a cross sectional rectangular shape) can be formed.

Moreover, formation failure of the wiring portion due to oozing of the paste or the like is less likely to occur compared with the case of the related art product in which the wiring portions are formed by printing, thereby allowing formation of the first v 221 with an accurate shape.

As a result, the transparent conductive film 22 can be thinly formed without reducing the conductivity of the first regions 221.

Therefore, light transmittance of the transparent conductive film 22 can be increased.

In the above manufacturing method, the ultraviolet light 24 is irradiated onto a portion of the transparent conductive film 223 to form the second regions 222 from the irradiated regions and form the first regions 221 from the non-irradiated regions. Therefore, the first regions 221 and the second regions 222 can be formed by easy operations.

A dry process can be adopted to the above film formation step and ultraviolet irradiation step. Therefore, the yield can be increased. Furthermore, the amount of emission of waste fluid can be suppressed, which is preferable also from the viewpoint of environmental conservation.

Without being bound to any theory regarding the reason why the transparent conductive film 223 undergoes reduction in conductivity in the region irradiated with the ultraviolet light 24, the following is believed:

In the above conductive polymer, the bond energy in the molecule is in the energy range of ultraviolet light. Therefore, the bond is radically cleaved by the irradiation of ultraviolet light. As a result, the conductivity is decreased.

The reason why the reaction of decrease in conductivity can be prompted by use of the radical polymerization initiator can be presumed as follows:

Radicals generated from the radical polymerization initiator by ultraviolet irradiation increase the reaction rate at which the conductivity of the conductive polymers is decreased.

In the present invention, a plurality of transparent conductive films may be provided. That is, a transparent conductive circuit substrate provided with two or more transparent conductive films on the base material is included in the scope of the invention.

The present invention can increase reactivity of conductive polymers to ultraviolet light by use of a radical polymerization initiator. Therefore, when a plurality of transparent conductive films are provided, first regions with an accurate shape can be formed even in transparent conductive film on the bottom layer side.

In the present invention, prior to the ultraviolet irradiation step, a curing step of drying and curing the transparent conductive film 223 may be performed.

The temperature condition in this step can be set to, for example, from 50 to 130° C. The treatment time may be from 1 to 10 minutes.

Curing the transparent conductive film 223 allows the mask 23 to abut the transparent conductive film 22 in the ultraviolet irradiation step.

Therefore, the regions 221 and 222 corresponding accurately to the shapes of the non-transmissive portions 231 and the transmissive portions 232 can be formed.

As for an electronic device to which the transparent conductive circuit substrate 211 is applied, a display apparatus such as an organic EL apparatus can be listed in which a light-emission element (not shown) is provided on the transparent conductive circuit substrate 211.

In the transparent conductive circuit substrate 211, the thickness of the transparent conductive film 22 can be made uniform, thereby making the light transmittance of the transparent conductive film 22 uniform.

Therefore, when the transparent conductive circuit substrate 211 is used for a display apparatus such as an organic EL apparatus, the display properties thereof can be improved.

As another example of an electronic device, a touch panel can be listed in which a conductive layer (not shown) is provided above the transparent conductive circuit substrate 211 spaced apart such that the conductive layer is brought into contact with the wiring portions 220 by depression from above.

Examples 2-1 to 2-8

A raw material liquid was prepared by adding a radical polymerization initiator (V-086 manufactured by Wako Pure Chemical Industries, Ltd.) to transparent conductive ink (Denatron #5002LA manufactured by Nagase & Co. Ltd.) including polythiophene-based conductive polymers.

The raw material liquid was coated by dip coating on a base material 1 made of a PET film (Lumirror S10 manufactured by Toray Industries, Inc.) with a length of 15 cm, a width of 15 cm, and a thickness of 188 μm to form a transparent conductive film 223, thereby obtaining a conductive substrate 210. The transparent conductive film 223 was dried at a temperature of 80° C. for two minutes to be cured.

Ultraviolet light 24 was irradiated onto the transparent conductive film 223 through a chrome mask 23 having non-transmissive portions with a width of 10 mm to obtain a transparent conductive circuit substrate 211 having first regions 221 (wiring portions 220) with a width of 10 mm and second regions 222. The irradiation intensity of the ultraviolet light 24 was 500 mW/cm$^2$.

The results of the chronological measurements of the surface resistance of the portions irradiated with the ultraviolet light 24 are shown in Table 3 and Table 4.

The surface resistances of the portions not irradiated with the ultraviolet light were the same in value as those at the start of the irradiation.

TABLE 2

|  |  | Example 2-1 | Example 2-2 | Example 2-3 | Example 2-4 |
|---|---|---|---|---|---|
| Transparent conductive film thickness (μm) |  | 0.4 | 0.4 | 0.4 | 0.4 |
| Amount to be added of polymerization initiator (% by mass) |  | 1 | 0 | 0.1 | 0.5 |
| Surface resistance (Ω/□) | At start of irradiation | 1200 | 700 | 760 | 900 |
|  | after 5 min. | $3.0 \times 10^6$ | $1.0 \times 10^3$ | $7.0 \times 10^3$ | $2.0 \times 10^5$ |
|  | after 10 min. | $1.0 \times 10^8 \uparrow$ | $1.0 \times 10^5$ | $2.0 \times 10^5$ | $5.0 \times 10^6$ |
|  | after 15 min. | $1.0 \times 10^8 \uparrow$ | $3.0 \times 10^6$ | $8.0 \times 10^6$ | $8.0 \times 10^6$ |

("$1.0 \times 10^8 \uparrow$ Ω/□" means that the measured value exceeded a measurement limit value of $1.0 \times 10^8$ Ω/□.)

TABLE 3

|  | Example 2-5 | Example 2-6 | Example 2-7 | Example 2-8 |
|---|---|---|---|---|
| Transparent conductive film thickness (μm) | 0.1 | 0.1 | 0.1 | 0.1 |
| Amount to be added of polymerization initiator (% by mass) | 1 | 0 | 0.1 | 0.5 |
| Surface resistance ($\Omega/\square$) At start of irradiation | 2800 | 2000 | 2100 | 2500 |
| after 5 min. | $1.0 \times 10^7$ | $3.0 \times 10^4$ | $7.0 \times 10^4$ | $1.0 \times 10^6$ |
| after 10 min. | $1.0 \times 10^8 \uparrow$ | $1.0 \times 10^6$ | $8.0 \times 10^6$ | $1.0 \times 10^8 \uparrow$ |
| after 15 min. | $1.0 \times 10^8 \uparrow$ | $1.0 \times 10^8 \uparrow$ | $1.0 \times 10^8 \uparrow$ | $1.0 \times 10^8 \uparrow$ |

("$1.0 \times 10^8 \uparrow$ $\Omega/\square$" means that the measured value exceeded a measurement limit value of $1.0 \times 10^8$ $\Omega/\square$.)

Table 2 and Table 3 show that addition of the radical polymerization initiator increased the resistance value in a short period of time.

Furthermore, Table 2 shows that by the addition of the radical polymerization initiator, high resistance values were allowed to be obtained even in the case of thick transparent conductive films.

These results reveal that using a radical polymerization initiator can form first regions 221 and second regions 222 whose ratio of resistance value is high.

Third Exemplary Embodiment

Figure 6:
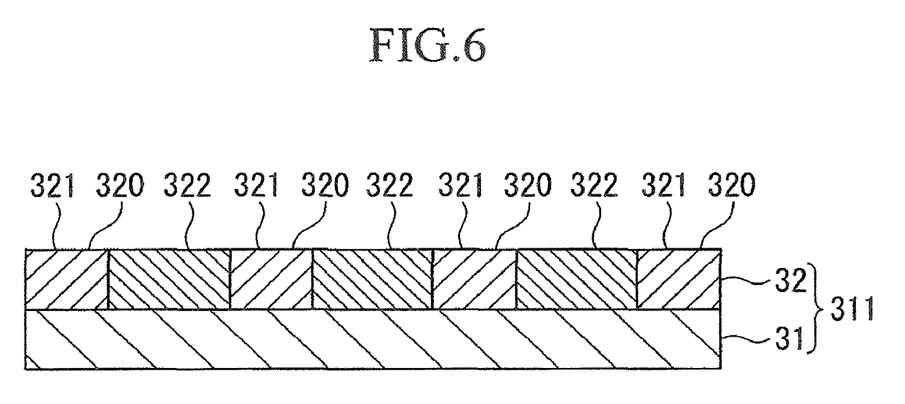
FIG. 6 is a schematic block diagram showing a transparent conductive circuit substrate usable in an electronic device according to a third embodiment of the present invention.

FIG. 6 is a cross-sectional view showing a part of one example of a transparent conductive circuit substrate according to a third embodiment of the present invention.

The transparent conductive circuit substrate 311 is furnished with a transparent conductive film 32 including conductive polymers on a base material 31.

The base material 31 is made of a transparent material, for example, polyethylene terephthalate (PET), and is formed in a plate or film shape.

The transparent conductive film 32 is made of polythiophene-based conductive polymers having an electrical resistance value that is increased by irradiation of ultraviolet light.

The transparent conductive film 32 has first regions 321 and second regions formed adjacent to the first regions 321.

The first regions 321 are low-resistance regions with a comparatively low electrical resistance value. The first regions 321 can have an electrical resistance value (surface resistance) of, for example, $10^3 \Omega/\square$ or less.

The first regions 321 are wiring portions 320 that are used for a transparent conductive circuit.

The first regions 321 are not particularly limited with respect to their shape. They may have a linear shape with a predetermined width.

The second regions 322 are high-resistance regions with an electrical resistance higher than that of the first regions 321.

The second regions 322 may have an electrical resistance value (surface resistance) $10^4$ or more times (preferably, but not necessarily, $10^5$ or more times) than that of the first regions 321. Specifically, they can have an electrical resistance value of $10^8 \Omega/\square$ or more.

Making the electrical resistance value of the second regions 322 $10^4$ or more times that of the first regions 321 can improve the insulativity between neighboring parts of the wiring portions 320, and make the conductivity of the wiring portions 320 favorable.

As for the polythiophene-based conductive polymer, for example, one formed with a cation structure by doping an undoped polymer having a principal chain of a polythiophene-based polymer shown in Formula (1) with a halogen such as iodine or other oxidant to partially oxidize the polymer can be used.

(1)

In Formula (1), groups $R^1$ and $R^2$ are independently selectable. The following can be exemplified: a hydrogen atom; a halogen atom such as fluorine, chlorine, bromine, or iodine; a cyano group; a straight-chain alkyl group such as methyl, ethyl, propyl, butyl (n-butyl), pentyl (n-pentyl), hexyl, octyl, dodecyl, hexadecyl, or octadecyl; a branched-chain alkyl group such as isopropyl, isobutyl, sec-butyl, tert-butyl, isopentyl, or neopentyl; an alkoxy group with a straight- or branched-chain such as methoxy, ethoxy, propoxy, isopropoxy, butoxy, isobutoxy, sec-butoxy, or tert-butoxy; an alkenyl group such as vinyl, propenyl, allyl, butenyl, or oleyl; an alkynyl group such as ethynyl, propynyl, or butynyl; an alkoxyalkyl group such as methoxymethyl, 2-methoxyethyl, 2-ethoxyethyl, and 3-ethoxypropyl; a polyether group such as $C_2H_5O(CH_2CH_2O)_mCH_2CH_2$ group (m is an integer equal to or more than one) or $CH_3O(CH_2CH_2O)_mCH_2CH_2$ group (m is an integer equal to or more than one a halogen-substituted derivative, such as a fluoromethyl group, in which the above substituent is substituted with fluorine or the like.

The conductive polymer may include a π-conjugated bond in the principal chain thereof.

As for the polythiophene-based polymer, 3,4-ethylenedioxythiophene) (PEDOT) is preferable. Especially, PEDOT-PSS, which is PEDOT doped with polystyrene sulfonate (PSS), may be used.

A conductive film made of PEDOT-PSS can be produced, for example, as follows.

Fe(III)tris-p-tolueiesulfonate solution and 1-butanol solution of imidazole are added to 3,4-ethylenedioxythiophene monomer. The mixture is coated on a base material. After the base material is heated and dried, the base material is rinsed in methanol to remove Fe(II)bis-p-toluenesulfonate.

As for commercially available products usable as polythiophene-based polymers, Baytron P manufactured by H. C. Starck-V TECH Ltd., Denatron #5002LA manufactured by Nagase & Co. Ltd., and Orgacon S300 manufactured by Agfa-Gevaert Group can be used.

Figure 7A:
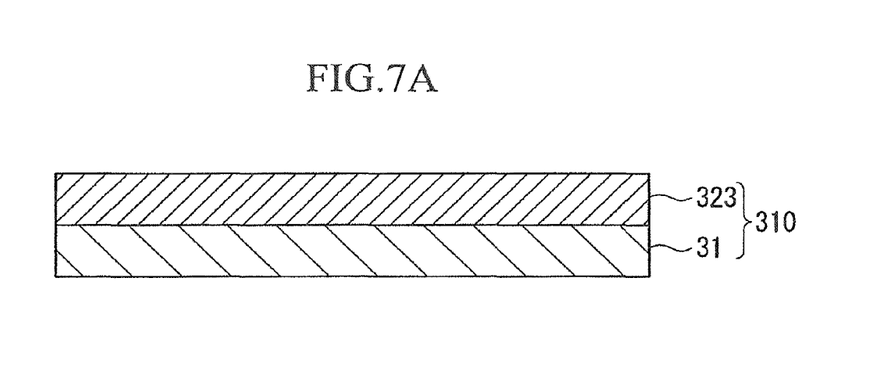
FIGS. 7A, 7B, and 7C are drawings illustrating a manufacturing method for the transparent conductive circuit substrate shown in FIG. 6 step-by-step.
Figure 7B:
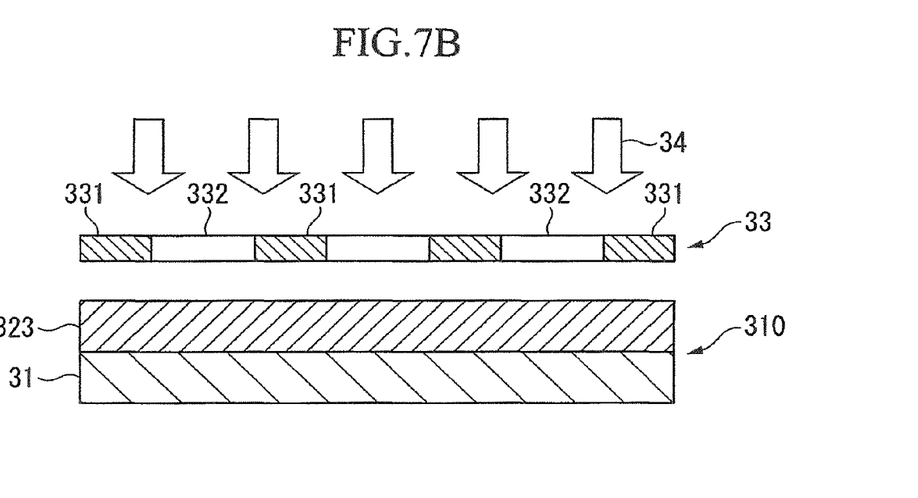
Figure 7C:
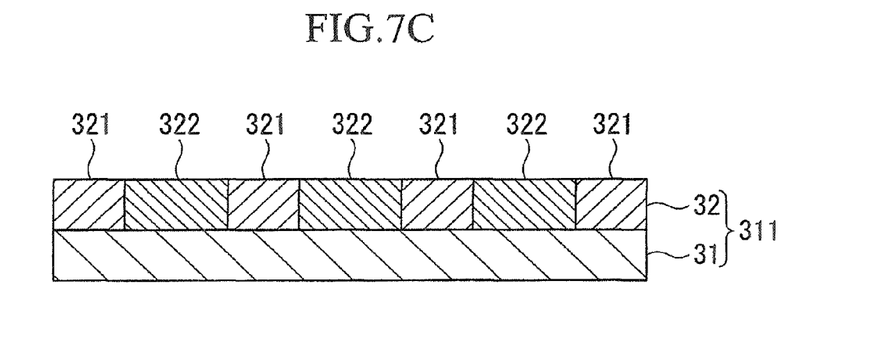

Next, a manufacturing method for the transparent conductive circuit substrate 311 according to the third embodiment of the present invention will be described.

As shown in FIG. 7A, a transparent conductive film 323 with a substantially uniform thickness is formed on a base material 31 by coating raw material liquid including conductive polymers over the entirety of the base material 31 or by other methods to obtain a conductive substrate 310 (film formation step).

Coating of the raw material liquid can be performed also by dip coating, spin coating, bar coating, or the like. Note that the transparent conductive film 323 may be formed by a method other than coating.

As shown in FIG. 7B, ultraviolet light 34 is irradiated onto the transparent conductive film 323.

At this time, a mask 33 with a non-transmissive portions 331 and a transmissive portions 332 is applied to the transparent conductive film 323, and the ultraviolet light 34 is irradiated through the mask 33 (ultraviolet irradiation step).

The ultraviolet light 34 has a wavelength of, for example, 230 to 280 nm.

The intensity of the ultraviolet light 34 may be 100 mW or more, and the irradiation time thereof may be one minute or more.

As shown in FIG. 7C, the portions irradiated with the ultraviolet light 34 through the transmissive portion 332 (irradiated portion) undergo a decrease in conductivity to form the second regions 322 as the high-resistance regions.

The portion shielded from the ultraviolet light 34 by the non-transmissive portions 331 (non-irradiated portions) do not undergo a decrease in conductivity and thus form the first regions 321, which are the low-resistance regions.

Figure 8:
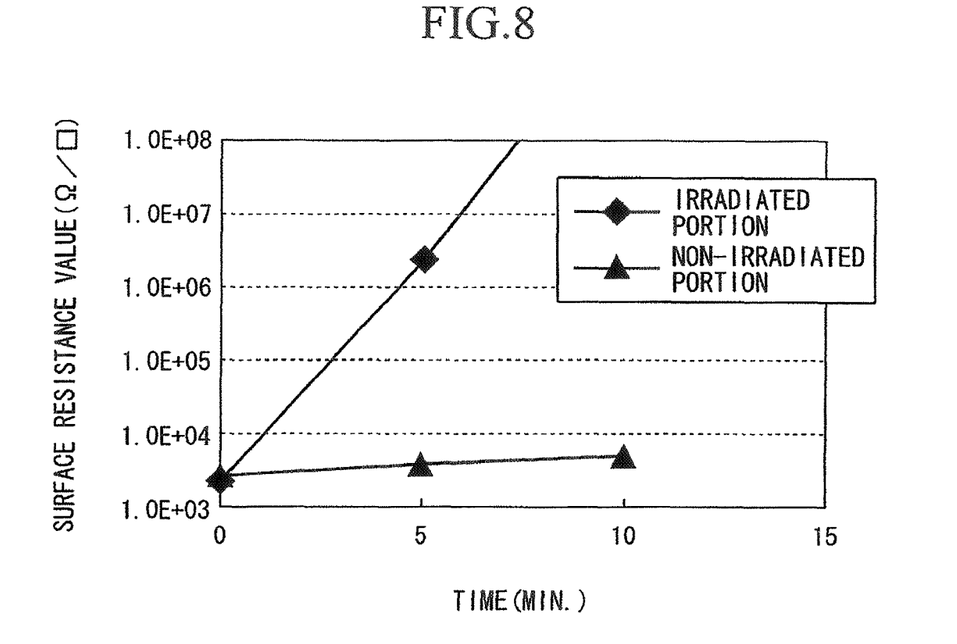
FIG. 8 is a graph showing the change in resistance value of the transparent conductive film by ultraviolet irradiation.

FIG. 8 shows one example of chronological change in surface resistance value of the irradiated portions and the non-irradiated portions. As shown in the figure, the non-irradiated portions have a small change in resistance value, while the resistance value of the irradiated portions rise gradually due to irradiation of the ultraviolet light 34.

When the irradiation direction of the ultraviolet light 34 is substantially perpendicular to the transparent conductive film 323, the regions 321 and 322 are substantially rectangular in cross-section.

By the above operations, the transparent conductive circuit substrate 311 shown in FIG. 6 is obtained.

In the transparent conductive circuit substrate 311, a transparent conductive film 32 is provided with the first regions 321 (low-resistance regions) as the wiring portions 320 and the second regions 322 (high-resistance regions).

As a result, formation failure of the wiring portions due to oozing of the paste or the like is less likely to occur compared with the case of the prior-art product in which the wiring portions are formed by printing, thereby allowing formation of the first regions 321 with an accurate shape.

Therefore, the conductivity of the wiring portions 320 can be made favorable. Furthermore, the wiring portions 320 with a narrow width can be formed with ease.

In the transparent conductive circuit substrate 311, the first regions 321 and the second regions 322 are both formed in the transparent conductive film 32, which leads to a simple configuration. This enables the manufacture thereof to be simple and low in cost.

Furthermore, the shape of the first regions 321 can be formed accurately. Thus, the transparent conductive film 32 can be thinly formed without reducing the conductivity of the first regions 321.

Therefore, light transmittance of the transparent conductive film 32 can be increased.

In the transparent conductive circuit substrate 311, the first regions 321 and the second regions 322 are both formed in the transparent conductive film 32, thereby making the surface of the transparent conductive circuit substrate 311 flat. This makes lamination of the wiring portion 320 easy compared with the case of the prior-art product in which the wiring portion is formed by printing.

In the above manufacturing method, the ultraviolet light 34 is irradiated onto a portion of the transparent conductive film 323 to form the second regions 322 from the irradiated regions and form the first regions 321 from the non-irradiated regions. Therefore, the first regions 321 and the second regions 322 can be formed by simple operations.

A dry process can be adopted to the above film formation step and ultraviolet irradiation step. Therefore, the yield can be increased. Furthermore, the amount of emission of waste fluid can be suppressed, which is preferable also from the viewpoint of environmental conservation.

Without being bound to any theory regarding the reason why the transparent conductive film 323 undergoes reduction in conductivity in the region irradiated with the ultraviolet light 34, the following is believed:

In the polythiophene-based polymer, the bond energy in the molecule is in the energy range of ultraviolet light. Therefore, the bond is radically cleaved by the irradiation of ultraviolet light. As a result, the conductivity is decreased.

In the present invention, it prior to the ultraviolet irradiation step, a curing step of drying and curing the transparent conductive film 323 can be performed.

The temperature condition in this step can be set to, for example, from 50 to 130° C. The treatment time may be from 1 to 10 minutes.

Curing the transparent conductive film 323 allows the mask 33 to abut the transparent conductive film 32 in the ultraviolet irradiation step.

Therefore, the regions 321 and 322 corresponding accurately to the shapes of the non-transmissive portions 331 and the transmissive portions 332 can be formed.

As for an electronic device to which the transparent conductive circuit substrate 311 is applied, a display apparatus such as an organic EL apparatus can be used in which a light-emission element (not shown) is provided on the transparent conductive circuit substrate 311.

In the transparent conductive circuit substrate 311, the thickness of the transparent conductive film 32 can be made uniform, thereby making the light transmittance of the transparent conductive film 32 uniform.

Therefore, when the transparent conductive circuit substrate 311 is used for a display apparatus such as an organic EL apparatus, the display properties thereof can be improved.

As another example of an electronic device, a touch panel can be used in which a conductive layer (not shown) is provided above the transparent conductive circuit substrate 311 spaced apart such that the conductive layer is brought into contact with the wiring portions 320 by depression from above.

Example 3-1

On a base material 31 made of a PET film (Lumirror S10 manufactured by Toray Industries, Inc.) with a length of 15 cm, a width of 15 cm, and a thickness of 188 μm, a transparent conductive film 323 made of transparent conductive ink was formed including polythiophene-based conductive polymers (Denatron #5002LA manufactured by Nagase & Co. Ltd.) by dip coating to obtain a conductive substrate 310. The transparent conductive film 323 was dried at a temperature of 80° C. for two minutes to be cured.

Ultraviolet light 34 was irradiated onto the transparent conductive film 323 through a chrome mask 33 having a non-transmissive portions 331 with a width of 10 mm to obtain a transparent conductive circuit substrate 311 having first regions 321 (wiring portions 320) with a width of 10 mm and a second region 322. The irradiation intensity of the ultraviolet light 14 was 500 mW/cm$^2$. The irradiation time thereof was 15 minutes.

The transparent conductive circuit substrate 311 was evaluated for its appearance, surface resistance, and light transmittance. The evaluation results are shown in Table 1.

Comparative Example 3-1

A paste including polythiophene-based polymers was used to form a wiring portion on a base material by screen printing to obtain a transparent conductive circuit substrate. Other conditions were in conformance with those of Example 3-1.

The transparent conductive circuit substrate was evaluated for its appearance, surface resistance, and light transmittance. The evaluation results are shown in Table 4.

TABLE 4

|  | Example 3-1 | Comparative Ex. 3-1 |
|---|---|---|
| Base material | PET film | PET film |
| Conductive substance | Polythiophene-based conductive polymer | Polythiophene-based conductive polymer |
| Method for forming wiring portions | Ultraviolet irradiation | Screen printing |
| Appearance of wiring portions | Continuous | Discontinuous due to bubbles |
| Surface resistance | 800 Ω/□ | 5 × 10$^3$ Ω/□ |
| Light transmittance | 75% | 62% |
| Width of wiring portions | 10 mm | 10 mm |

Table 4 shows that Example 3-1, in which the first regions 321 and the second regions 322 were formed in the transparent conductive film 32 and the first regions 321 were used as the wiring portions 320, experienced less shape deformation in the portions 320 and consequently favorable conductivity compared with Comparative Example 3-1, in which the wiring portions were formed by the printing method.

Furthermore, Example 3-1 was capable of obtaining a result superior to that of Comparative Example 3-1 also in terms of light transmittance.

Example 3-2

A conductive substrate 310 was manufactured in the similar manner as that of Example 3-1.

Ultraviolet light 34 was irradiated through a chrome mask 33 having non-transmissive portions 331 with a width of 5 mm and transmissive portions 332 with a width of 5 mm to obtain a transparent conductive circuit substrate 311 having first regions 321 (wiring portions 320) with a width of 5 mm and second regions 322 with a width of 5 mm. The irradiation intensity of the ultraviolet light 34 was 500 mW/cm$^2$. The irradiation time thereof was 15 minutes. Other conditions were in conformance with those of Example 3-1.

The first regions 321 as the non-irradiated regions and the second regions 322 as the irradiated regions were evaluated for their appearance, surface resistance and insulativity between neighboring parts of the wiring portions 320. The evaluation results are shown in Table 2.

Comparative Examples 3-2 to 3-4

A transparent conductive circuit substrate 311 was manufactured in a similar manner to Example 3-2, the exception being that the time for the ultraviolet irradiation was set to three minutes, five minutes, or ten minutes. The evaluation results are shown in Table 5.

TABLE 5

|  | Example 3-2 | | Comparative Example 3-2 | | Comparative Example 3-3 | | Comparative Example 3-4 | |
|---|---|---|---|---|---|---|---|---|
| Base material | PET film | | PET film | | PET film | | PET film | |
| Conductive substance | Polythiophene-based conductive polymer | | Polythiophene-based conductive polymer | | Polythiophene-based conductive polymer | | Polythiophene-based conductive polymer | |
| Method for forming wiring portions | Ultraviolet irradiation | | Ultraviolet irradiation | | Ultraviolet irradiation | | Ultraviolet irradiation | |
| Irradiation time | 15 min. | | 3 min. | | 5 min. | | 10 min. | |
| Appearance | Irradiated portions | Non-irradiated portions | Irradiated portions | Non-irradiated portions | Irradiated portions | Non-irradiated portions | Irradiated portions | Non-irradiated portions |
| Surface resistance (Ω/□) | 1.0 × 10$^8$↑ | 800 | 1.0 × 10$^4$ | 800 | 1.0 × 10$^6$ | 800 | 1.0 × 10$^7$ | 800 |
| Width | 5 mm | 5 mm | 5 mm | 5 mm | 5 mm | 5 mm | 5 mm | 5 mm |
| Insulativity between parts of wiring portions | A | | C | | C | | C | |

("1.0 × 10$^8$↑ Ω/□" means that the measured value exceeded a measurement limit value of 1.0 × 10$^8$ Ω/□. A = good, C = bad)

Table 5 shows that the longer the irradiation time is, the higher the resistance value of the irradiated portions are and that a transparent conductive circuit substrate with a sufficient insulation between parts of the wiring portions was obtained by 15 minutes of irradiation.

INDUSTRIAL APPLICABILITY

The electronic device manufacturing method of the present invention can provide the transparent conductive film with favorable conductivity. Therefore, it is applicable to precise electronic devices such as organic EL apparatuses, touch panels, and integrated circuits.

The invention claimed is:

1. A transparent conductive circuit substrate comprising: a transparent conductive film, comprising conductive polymers and a radical polymerization initiator, disposed on a base material, wherein the transparent conductive film comprises a plurality of first regions and a plurality of second regions, wherein the second regions have an electrical resistance value higher than that of the first regions, each of the second regions is between and adjacent to first regions along a surface of the base material;

the first regions form wiring portions of a circuit disposed on the base material;

the first regions and the second regions are directly disposed on the base material;

an electronic resistance value of the second regions is at least $10^4$ times higher than an electronic resistance value of the first regions; and the second regions are formed by irradiating the conductive film with an ultraviolet light which has a wavelength that exhibits an absorbance in an absorption spectrum of the conductive polymers that is two or more times higher than that of a background radiation.

2. The transparent conductive circuit substrate according to claim 1, wherein each of the second regions is an insulating portion.

3. An electronic device comprising the transparent conductive circuit substrate according to claim 1.

4. The transparent conductive circuit substrate according to claim 1, wherein the conductive polymers of the transparent conductive film are polythiophene-based polymers having a bond energy in an energy range of ultraviolet light.

5. A transparent conductive circuit substrate comprising:

a transparent conductive film, comprising polythiophene-based conductive polymers and a radical polymerization initiator, disposed on a base material, wherein the transparent conductive film comprises a plurality of first regions and a plurality of second regions, wherein the second regions have an electrical resistance value higher than that of the first regions, wherein the first regions form wiring portions of a circuit disposed on the base material;

each of the second regions is between and adjacent to first regions along a surface of the base material;

the first regions and the second regions are directly disposed on the base material;

an electronic resistance value of the second regions is at least $10^4$ times higher than an electronic resistance value of the first regions; and the second regions are formed by irradiating the conductive film with an ultraviolet light which has a wavelength that exhibits an absorbance in an absorption spectrum of the conductive polymers that is two or more times higher than that of a background radiation.

6. An electronic device comprising the transparent conductive circuit substrate according to claim 5.

7. The transparent conductive circuit substrate according to claim 5, wherein the conductive polymers of the transparent conductive film are polythiophene-based polymers having a bond energy in an energy range of ultraviolet light.

\* \* \* \* \*